United States Patent
Motwani

(10) Patent No.: US 9,912,355 B2
(45) Date of Patent: Mar. 6, 2018

(54) DISTRIBUTED CONCATENATED ERROR CORRECTION

(71) Applicant: INTEL CORPORATION, Santa Clara, CA (US)

(72) Inventor: Ravi H. Motwani, San Diego, CA (US)

(73) Assignee: INTEL CORPORATION, Santa Clara, CA (US)

(*) Notice: Subject to any disclaimer, the term of this patent is extended or adjusted under 35 U.S.C. 154(b) by 49 days.

(21) Appl. No.: 14/866,506

(22) Filed: Sep. 25, 2015

(65) Prior Publication Data
US 2017/0093438 A1    Mar. 30, 2017

(51) Int. Cl.
| H03M 13/29 | (2006.01) |
| G06F 11/10 | (2006.01) |
| G11C 29/52 | (2006.01) |
| G11C 29/04 | (2006.01) |

(52) U.S. Cl.
CPC ......... *H03M 13/29* (2013.01); *G06F 11/1012* (2013.01); *G06F 11/1068* (2013.01); *G11C 29/52* (2013.01); *H03M 13/2906* (2013.01); *G11C 2029/0411* (2013.01)

(58) Field of Classification Search
CPC ............. H03M 13/29; H03M 13/2906; H03M 13/2909; G06F 11/1048; G06F 11/1068; G06F 11/1072
See application file for complete search history.

(56) References Cited

U.S. PATENT DOCUMENTS

| 8,239,725 | B2* | 8/2012 | Radke ................ G06F 11/1068 714/752 |
| 8,495,467 | B1* | 7/2013 | Billing .................. G11C 29/42 714/764 |
| 8,510,628 | B2* | 8/2013 | Bedeschi ............ G06F 11/1048 714/746 |
| 9,213,602 | B1* | 12/2015 | Alhussien .......... G06F 11/1068 |
| 9,405,624 | B2* | 8/2016 | Alhussien .......... G06F 11/1076 |
| 2004/0095833 | A1 | 5/2004 | Marisetty et al. |
| 2007/0089035 | A1 | 4/2007 | Alexander et al. |
| 2007/0157069 | A1 | 7/2007 | Lyakh et al. |
| 2008/0012653 | A1 | 1/2008 | Chen et al. |

(Continued)

OTHER PUBLICATIONS

Wikipedia, "Concatenated Error Correction Code", Sep. 8, 2015, retrieved from the Internet at <URL: https://en.wikipedia.org/wiki/Concatenated_error_correction_code>, Total 6 pp.

(Continued)

*Primary Examiner* — Shelly A Chase
(74) *Attorney, Agent, or Firm* — Konrad Raynes Davda & Victor LLP

(57) ABSTRACT

In one embodiment, a distributed concatenated error correction logic is disposed on separate integrated circuit dies to facilitate efficiency. In one embodiment, an inner error correction code logic of the distributed concatenated error correction logic is disposed on an integrated circuit die of a memory circuit and an outer error correction code logic of the distributed concatenated error correction logic is disposed on an integrated circuit die of a memory controller. In one aspect, it is believed that such an arrangement may be employed to increase the usefulness of memory controllers for later generation memory circuits. Other aspects are described herein.

18 Claims, 7 Drawing Sheets

(56) References Cited

U.S. PATENT DOCUMENTS

| | | |
|---|---|---|
| 2008/0104476 A1 | 5/2008 | Holman |
| 2009/0158122 A1 | 6/2009 | Gagnon |
| 2012/0151301 A1* | 6/2012 | Izumi .............. G06F 11/1048 714/773 |
| 2013/0003480 A1* | 1/2013 | D'Abreu ............ G06F 13/1668 365/218 |
| 2014/0006904 A1 | 1/2014 | Gendler |
| 2014/0181615 A1 | 6/2014 | Kwok |
| 2014/0281261 A1 | 9/2014 | Vera et al. |
| 2015/0149857 A1 | 5/2015 | Motwani et al. |

OTHER PUBLICATIONS

Wikipedia, "Convolutional Code", Sep. 8, 2015, retrieved from the Internet at <URL: https://en.wikipedia.org/wiki/Convolutional_code>, Total 10 pp.

Wikipedia, "Error Detection and Correction", Sep. 10, 2015, retrieved from the Internet at <URL: https://en.wikipedia.org/wiki/Error_detection_and_correction>, Total 10 pp.

Wikipedia, "Forward Error Correction", Sep. 8, 2015, retrieved from the Internet at <URL: https://en.wikipedia.org/wiki/Forward_error_correction#Interleaving>, Total 9 pp.

Wikipedia, "Reed-Solomon Error Correction", Sep. 8, 2015, retrieved from the Internet at <URL: https://en.wikipedia.org/wiki/Reed%E2%80%93Solomon_error_correction>, Total 16 pp.

Cioffi, J.M., "Chapter 11: Code Concatenation and Advanced Codes", [online], Materials for Classic EE379 Series Courses, EE379B: Digital Communications—Coding, [Dated Feb. 11, 2014; Retrieved on May 8, 2017], Retrieved from the Internet at <URL: https://web.stanford.edu/group/cioffi/doc/book/chap11.pdf>, 69 pp.

* cited by examiner

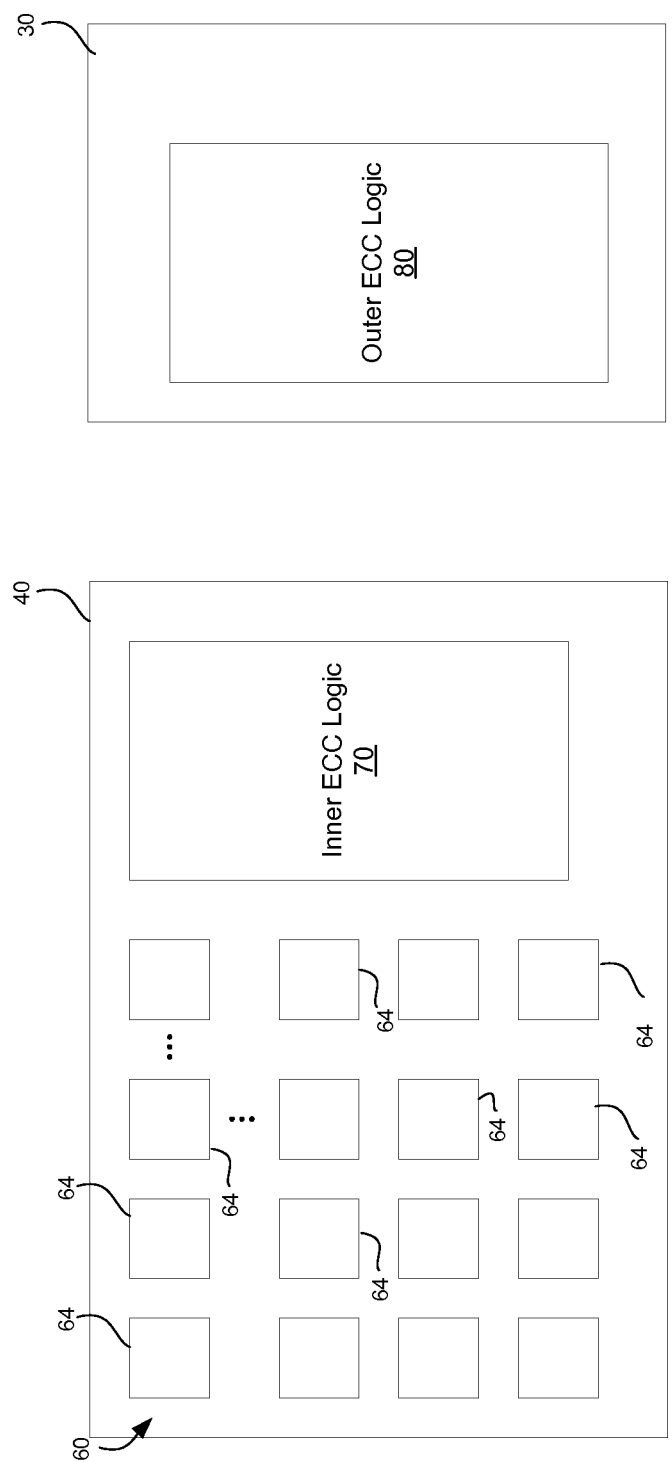

DISTRIBUTED CONCATENATED ERROR CORRECTION

TECHNICAL FIELD

Certain embodiments of the present description relate generally to devices such as memory employing error correction.

BACKGROUND

In the course of reading data from a memory, errors may be introduced such that the data read from memory may not match the original data stored in memory. Similarly, as data is written to the memory, errors may be introduced such that the data stored in memory may not match the original data intended to be written. Also, data may become corrupted while stored in a memory.

Various techniques are frequently employed for purposes of detecting such errors and correcting them if possible. For example, a memory controller may have Error Correction (or Correcting) Code (ECC) encoder logic for purposes of encoding the data before it is written into the memory cells of the memory. Such encoding frequently includes adding redundant data such as parity bits, for example, to the original write data. The encoded data when subsequently read from the memory, may be decoded by a decoder of the ECC logic of the memory controller to restore the original write data. The ECC decoder logic can frequently detect errors which may have occurred in transmission to or from the memory or while the data was stored in memory, and correcting them if not too severe. Generally, the more redundant data added to the write data by the ECC encoder logic, the more robust the error detection and correcting capabilities of the ECC decoder logic of the memory controller.

A memory typically has an associated Raw Bit Error Rate (RBER) which may be a function of a number of factors including the fabrication process used to fabricate the memory cells of the memory integrated circuits and the packing density of the memory cells, for example. Thus, as the designs of memory integrated circuits change, the associated RBER of each design generation may change as well, frequently getting worse as the packing density increases each new generation. As a result, the ECC logic of the memory controller for the new memory design is often upgraded to provide an increased level of error detection and correction, to compensate for an increase in the RBER of the new memory design.

There are various known ECC techniques for detecting and correcting data errors including for example, block codes such as Reed-Solomon error correction codes, for example, which process data on a block-by-block basis, and convolutional codes, for example, which process data on a bit-by-bit basis. In some applications such as deep space transmission of data between Earth and space probes, and compact disk recording and playback devices, for example, it is known to encode data twice using two different ECC schemes which are concatenated together as an outer ECC scheme and an inner ECC scheme, to operate in sequence on the data. Thus, an outer encoder encodes the data first using the outer ECC scheme, and an inner encoder encodes the previously encoded data a second time, using the inner ECC scheme. Conversely, an inner decoder of the inner ECC scheme decodes the concatenated encoded (twice encoded) data a first time and an outer decoder of the outer ECC scheme decodes the encoded data a second time, that is, decodes the outer ECC encoded data. By concatenating the EEC techniques, error detection and correction can be enhanced in some applications, as compared to employing just one of the ECC techniques alone.

Errors in data often occur randomly. Many concatenated error correction schemes employ interleaving to shuffle the data to spread errors which occur during decoding of the inner code. Shuffling or interleaving is usually done to ensure that the inner decoder burst of errors gets distributed amongst different outer codes.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 2 depicts an example of a basic architecture of a memory and memory controller, employing distributed concatenated error correction in accordance with an embodiment of the present disclosure.

DESCRIPTION OF EMBODIMENTS

Figure 1:
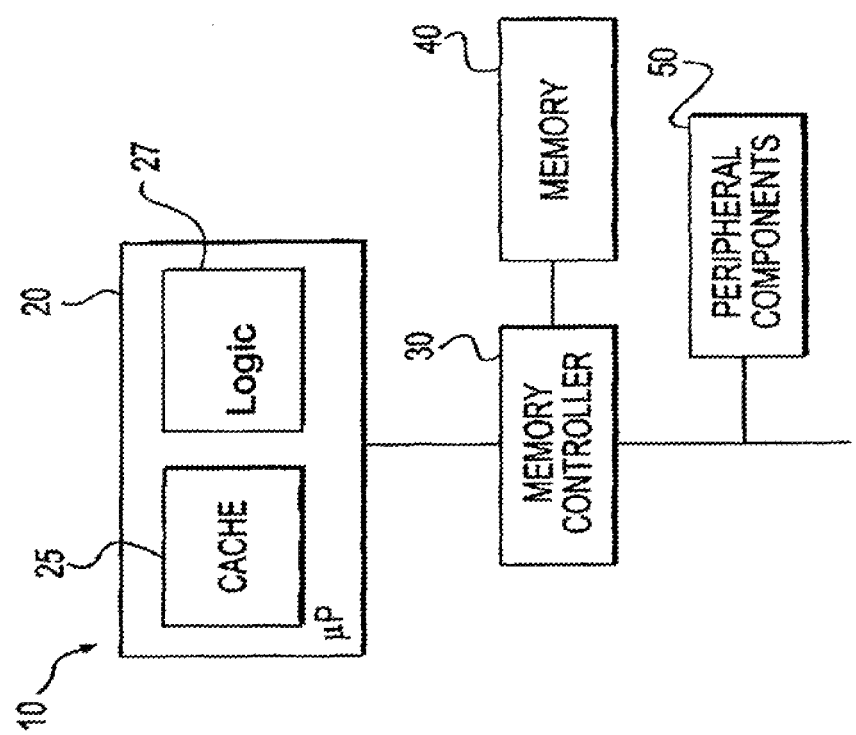
FIG. 1 depicts a high-level block diagram illustrating selected aspects of a system, employing distributed concatenated error correction in accordance with an embodiment of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

Distributed concatenated error correction in accordance with one aspect of this disclosure, is employed in a memory controller and memory circuits containing arrays of memory cells or memory cells controlled by the memory controller. In one embodiment, the distributed concatenated error correction logic includes an outer ECC logic disposed on the integrated circuit die of the memory controller, for example, and an inner ECC logic disposed on one or more integrated circuit dies which are different from the die on which the outer ECC logic is disposed. For example, the inner ECC logic may be disposed on one or more dies of the memory circuits containing arrays of memory cells "hereinafter referred to frequently as "memory circuits," for example, while the outer ECC logic is disposed on the die of the memory controller, for example. Although embodiments of distributed concatenated error correction in accordance with one aspect of this disclosure, are described as having an outer ECC logic disposed on the die of the memory controller and an inner ECC logic disposed on the die of one or more of the memory circuits, it is appreciated that distributed concatenated error correction in accordance of the present description may be distributed over separate dies of various other circuits such as microprocessors and Input/Output circuits, for example, depending upon the particular application.

As explained in greater detail below, such an arrangement may, for example, obviate upgrading the ECC logic of the memory controller each time the design of the memory circuits changes, notwithstanding that the next generation memory circuit design may have an increased RBER. For example, should a new memory circuit design exhibit an increase in RBER as compared to the prior generation memory circuit design, the increased RBER may be accommodated by upgrading the inner ECC logic which may in one embodiment, be disposed on the same integrated circuit dies as the memory cells of the memory circuits. Conversely, the outer ECC logic which may be disposed on the memory controller which is typically on a separate die, may remain unchanged.

It is believed that distributed concatenated error correction in accordance with the present description may be applied to systems employing a variety of types of memory devices including non-volatile memory such as three dimensional (3D) crosspoint, phase change memory, spin torque transfer (STT) Random Access Memory (RAM), magnetic RAM, and volatile memory such as 2D RAM, for example. Other types of memory may be suitable as well. Distributed concatenated error correction in accordance with embodiments described herein can be used either in stand-alone memory controllers and memory circuits or logic arrays, or can be embedded in microprocessors, digital signal processors (DSPs) or other circuits transmitting or receiving data. Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of devices, memory and logic devices.

Turning to the figures, FIG. 1 is a high-level block diagram illustrating selected aspects of a system implementing distributed concatenated error correction, according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Storage of the peripheral components 50 may be, for example, non-volatile storage, such as solid-state drives, magnetic disk drives, optical disk drives, a tape drive, flash memory, etc.). The storage may comprise an internal storage device or an attached or network accessible storage. The microprocessor 20 is configured to write data in and read data from the memory 40. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to render information on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate.

One or more of the components of the device 10 may be omitted, depending upon the particular application. For example, a network router may lack a video controller, for example. Any one or more of the memory devices 25, 40, and the other devices 10, 30, 50 may include distributed concatenated error correction in accordance with the present description.

FIG. 2 shows an example of an array 60 of rows and columns of bitcells or memory cells 64 of a volatile DRAM memory circuit 40 in accordance with one embodiment of the present description. In another embodiment, the memory circuit may be a non-volatile memory such as a three dimension (3D) Crosspoint memory, for example. It is appreciated that the memory circuit 40 may be other types of memory as well. Each memory cell 64 is capable of storing a bit of data representing a logical one or logical zero value. The DRAM memory circuit 40 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation.

As explained in greater detail below, the memory circuit 40 of this embodiment, includes inner error correction logic 70 of a distributed error correction logic distributed over both the memory circuit 40 and the memory controller 30.

Similarly, the memory controller 30 of this embodiment includes an outer ECC logic 80 of the distributed error correction logic.

In addition to the operations of the outer ECC logic 80, the memory controller 30 of this embodiment performs read operations, write operations, refresh operations and charge level maintenance to the memory cells 64. The memory controller 30 including the outer ECC logic 80, is configured to perform the described operations using appropriate hardware, software or firmware, or various combinations thereof. The memory circuit 40 including the inner ECC logic 70, is similarly configured to perform its described operations using appropriate hardware, software or firmware, or various combinations thereof.

Figures 3A, 3B:
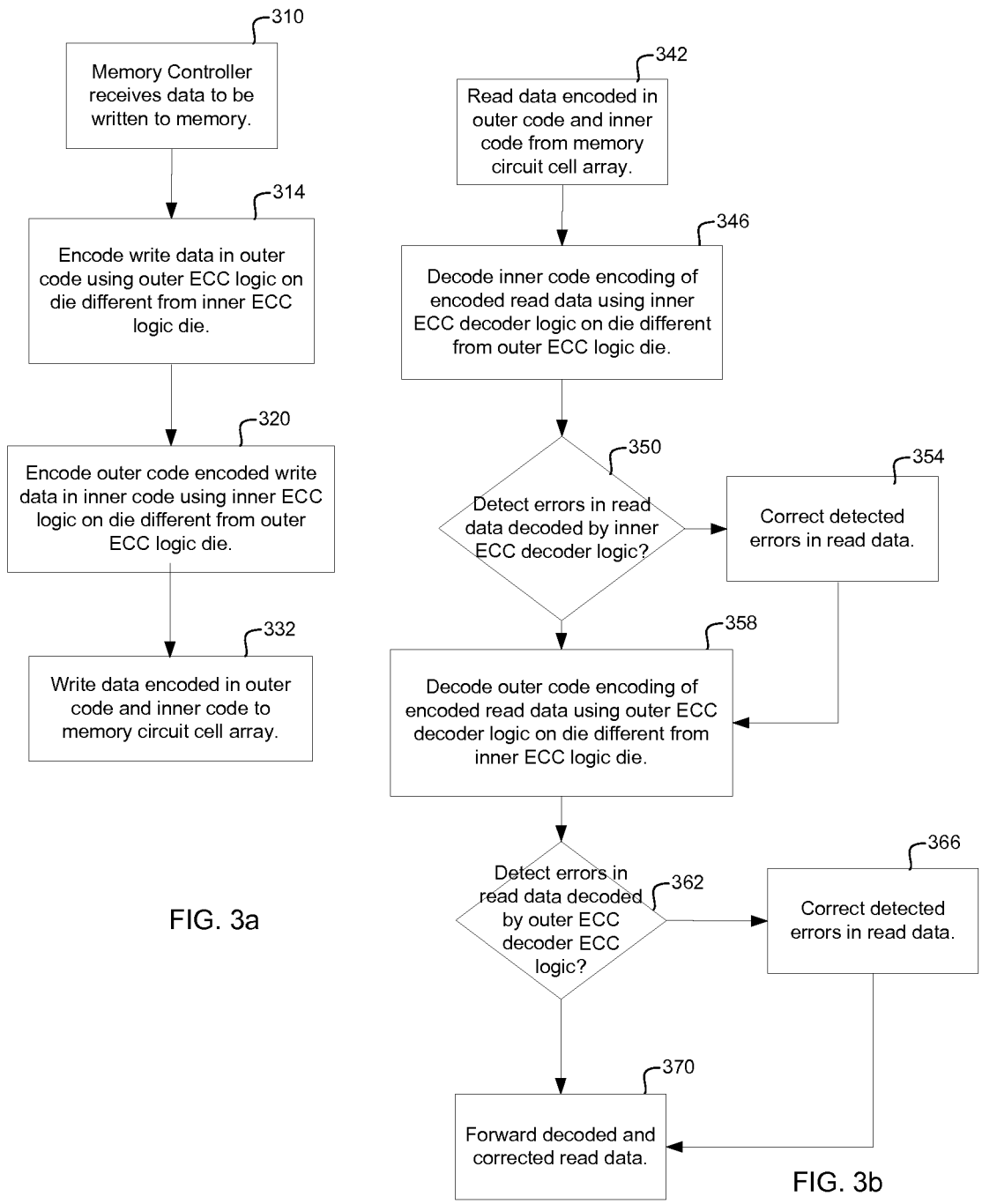
FIGS. 3a and 3b provide examples of operations for distributed concatenated error correction in accordance with an embodiment of the present disclosure.

FIGS. 3a and 3b depict examples of distributed error correction operations in accordance with one embodiment of the present description. FIG. 3a is directed to memory write operations and FIG. 3b is directed to memory read operations.

In one operation of a memory write operation (FIG. 3a), a memory controller such as the memory controller 30 (FIG. 2) receives write data to be written to a memory such as the memory circuit 40. Before the write data is written to the memory, the write data is encoded (block 314) in a first encoding of distributed concatenated error correction in accordance with one embodiment of the present description. More specifically, in this embodiment, the write data is encoded in an outer error correction code of the distributed concatenated error correction using ECC logic on a die different from the die on which inner ECC logic is disposed.

One example of a suitable outer error correction code is a Reed-Solomon error correction code which is a block code which encodes blocks of data in symbols to facilitate error detection and correction. It is appreciated that other types of error correction codes may be employed in an outer correction code of distributed concatenated error correction in accordance with the present description. For example, it is believed that both block and convolutional codes may be suitable as an outer code for distributed concatenated error correction in accordance with the present description. Also, it is believed that both systematic and nonsystematic codes may be suitable as an outer code for distributed concatenated error correction in accordance with the present description. In a systematic scheme, an encoder attaches to the original data a number of check bits (or parity data), which are derived from the data bits by an appropriate deterministic algorithm. In a system that uses a non-systematic code, the original message is transformed into an encoded message that typically has at least as many bits as the original message. Additional examples of codes which may be suitable as outer codes are recursive codes, non-recursive codes, repetition codes, Hamming codes, multidimensional parity-check codes, turbo codes, low-density parity-check codes (LDPC), recursive codes, nonrecursive codes, etc.

Figure 4:
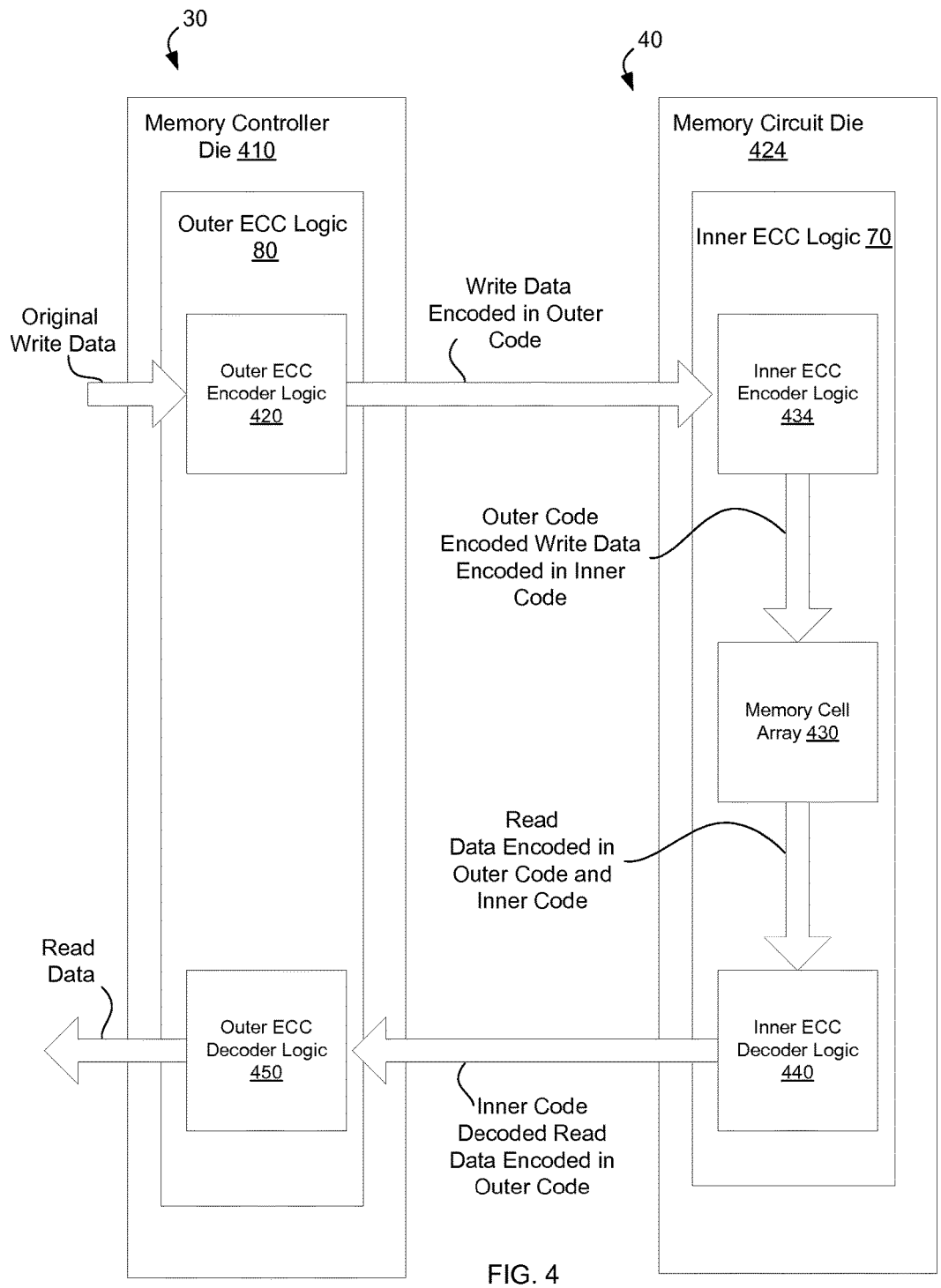
FIG. 4 illustrates in greater detail an architecture of a memory and memory controller, employing distributed concatenated error correction in accordance with an embodiment of the present disclosure.

FIG. 4 shows an embodiment of the memory controller 30 which includes a memory controller die 410 on which some or all of the integrated circuits of the memory controller 30 are disposed. Included among the integrated circuits of the memory controller 30 disposed on the memory controller die 410, is an outer ECC encoder logic 420 of the outer ECC logic 80. The outer ECC encoder logic 420 is configured to encode write data for the memory circuit in an outer error correction code (such as a Reed-Solomon error correction code, for example) of the distributed concatenated error correction in accordance with one embodiment of the present description.

As shown in FIG. 4, outer ECC encoder logic 420 is disposed on a die which in this embodiment, is the memory controller die 410, which is different from a die 424 on which the inner ECC logic 70 of the memory circuit 40 is disposed. Although the embodiment of FIG. 4 depicts the outer ECC logic 414 and the inner ECC logic 70 as disposed on the memory controller die 410 and the memory circuit die 424, respectively, it is appreciated that the outer and inner ECC logic circuits of distributed concatenated error correction in accordance with the present description, may be distributed over other types of separate dies such as the dies of processors, I/O controllers, etc.

In one embodiment, the outer ECC encoder logic 420 encodes the write data in an outer error correction code which adds redundant data such as parity bits, for example. Other examples of redundant data which may be added for purposes of error detection and correction include repetition codes, checksums and cyclic redundancy checks (CRCs). As explained in greater detail below, the write data encoded in the outer error correction code may subsequently be decoded and checked for errors. In many cases, depending upon the severity of the detected errors, the decoded data may be corrected and restored to its original error-free form before it was written to the memory.

In another operation of the write operations of FIG. 3a, the write data which was encoded (block 314, FIG. 3a) with the outer error correction code, is encoded (block 320) in a second encoding of distributed concatenated error correction in accordance with one embodiment of the present description. Thus, the write data is encoded twice. More specifically, in the second encoding of this embodiment, the outer error correction code encoded write data is encoded in an inner error correction code using inner ECC logic disposed on a die different from the die of the outer ECC logic of the distributed concatenated error correction logic. One example of a suitable inner error correction code is a convolutional error correction code which encodes data on a bit by bit basis to facilitate error detection and correction. A convolutional error correction code typically generates parity symbols via the sliding application of a boolean polynomial function to a data stream. It is appreciated that other types of error correction codes may be employed in an inner correction code of distributed concatenated error correction in accordance with the present description. For example, it is believed that both block and convolutional codes may be suitable as an inner code for distributed concatenated error correction in accordance with the present description. Also, it is believed that both systematic and nonsystematic codes may be suitable as an inner code for distributed concatenated error correction in accordance with the present description. Additional examples of codes which may be suitable as inner codes are recursive codes, non-recursive codes, repetition codes, Hamming codes, multidimensional parity-check codes, turbo codes, low-density parity-check codes (LDPC), recursive codes, nonrecursive codes, etc.

In the embodiment of FIG. 4, the inner ECC logic 70 is disposed on the memory circuit die 424 of the memory circuit 40. The memory circuit die 424 includes some or all of the integrated circuits of the memory 40 such as an array 430 of memory cells, or driver or amplifier circuits for write data to or reading data from the memory cell array 430.

In this embodiment, included among the integrated circuits of the memory 40 disposed on the memory circuit die 424, is an inner ECC encoder logic 434 of the inner ECC logic 70. The inner ECC encoder logic 424 is configured to encode in an inner error correction code (such as a convolutional error correction code, for example), outer error correction code encoded write data from the memory controller 30 so that write data is encoded in first the outer error correction code and then the inner error correction code of the distributed concatenated error correction in accordance with one embodiment of the present description. The write data encoded in both the outer error correction code and the inner error correction code in accordance with the illustrated embodiment of distributed concatenated error correction, is written (block 332, FIG. 3a) to a memory circuit cell array, such as the memory cell array 430 (FIG. 4), for example.

FIG. 4 depicts a single memory circuit die 424 of the memory 40 for clarity purposes. It is appreciated that a memory may have many banks of memory circuit dies, each memory circuit die having a memory cell array such as the memory cell array 430. In one embodiment, each such memory circuit die 424 may have disposed thereon an inner ECC encoder logic similar to the inner ECC encoder logic 434 of FIG. 4. In other embodiments, an inner ECC encoder logic on one memory circuit die may encode outer error correction code encoded write data from the memory controller 30 for other memory circuit dies such that an inner ECC encoder logic may not be located on every memory circuit die of the memory. Also, in some embodiments, the inner ECC encoder logic may be disposed on an integrated circuit die other than a memory circuit die, and which is separate from the die on which the outer ECC encoder logic is disposed.

In one embodiment, the inner ECC encoder logic 434 encodes the outer error correction code encoded write data in an inner error correction code which adds redundant data such as parity bits, for example. Other examples of redundant data which may be added by the inner code for purposes of error detection and correction include repetition codes, checksums and cyclic redundancy checks (CRCs). As explained in greater detail below, the write data encoded in the inner error correction code may subsequently be decoded and checked for errors. In many cases, depending upon the severity of the detected errors, the decoded data may be corrected and restored to the error-free form of the outer error correction code encoded write data before it was encoded in the inner error correction code and written to the memory.

In the illustrated embodiment, the distributed concatenated error correction includes a first and second encoding by an outer ECC encoder and an inner ECC encoder, respectively. However, it is appreciated that distributed concatenated error correction in accordance with the present description may employ more than two encoding schemes, depending upon the particular application.

FIG. 3b is directed to memory read operations. In one operation of a memory read operation (FIG. 3b), a memory controller such as the memory controller 30 (FIG. 2) causes data previously concatenated encoded in both the inner error correction code and the outer error correction code to be read (block 342) from a memory such as the memory circuit 40. The concatenated encoded (or twice encoded, in this embodiment) read data is decoded (block 346) in a first decoding of distributed concatenated error correction in accordance with one embodiment of the present description. More specifically, the concatenated encoded read data is decoded from the inner ECC code of the concatenated error correction using inner ECC logic on a die different from the die on which the outer ECC logic is disposed. As previously mentioned, the inner ECC code may be a convolutional error correction code, for example, but it is appreciated that other error correction codes may be employed in an inner correction code of distributed concatenated error correction in accordance with the present description.

FIG. 4 shows an embodiment of the memory circuit die 424 of the memory circuit 40 which includes an inner ECC decoder logic 440 of the inner ECC logic 70. The inner ECC decoder logic 440 is configured to decode in accordance with the inner error correction code, concatenated encoded read data from the memory circuit which has previously been encoded in both the outer error correction code and the inner error correction code so that following the first decoding from the inner error correction code, the encoded read data is no longer encoded with respect to the inner error correction code. At this point, the encoded read data remains encoded in accordance the outer error correction code.

As shown in FIG. 4, inner ECC decoder logic 440 is disposed on a die which in this embodiment, is the memory circuit die 424, which is different from a die 410 on which an outer ECC decoder logic of the outer ECC logic 80 of the memory controller 30 is disposed. Although the embodiment of FIG. 4 depicts the inner ECC decoder logic 440 and the outer ECC decoder logic 450 as disposed separately on the memory circuit die 424 and the memory controller die 410, respectively, it is appreciated that the inner and outer ECC decoder logics of distributed concatenated error correction in accordance with the present description, may be distributed separately over other types of separate dies such as the dies of processors, I/O controllers, etc.

In another operation of FIG. 3b, the read data being processed by the inner ECC decoder logic may be checked (block 350, FIG. 3b) by an error detection logic of the inner ECC decoder logic, to determine if the decoded read data contains erroneous data. Such erroneous data may have been caused by corruption of the concatenated ECC encoded write data which may have occurred at various stages such as when the concatenated encoded write data was transmitted to the memory cell array 430 or while the encoded write data was being stored in the memory cell array 430, or being read from the memory cell array, for example.

Figure 5:
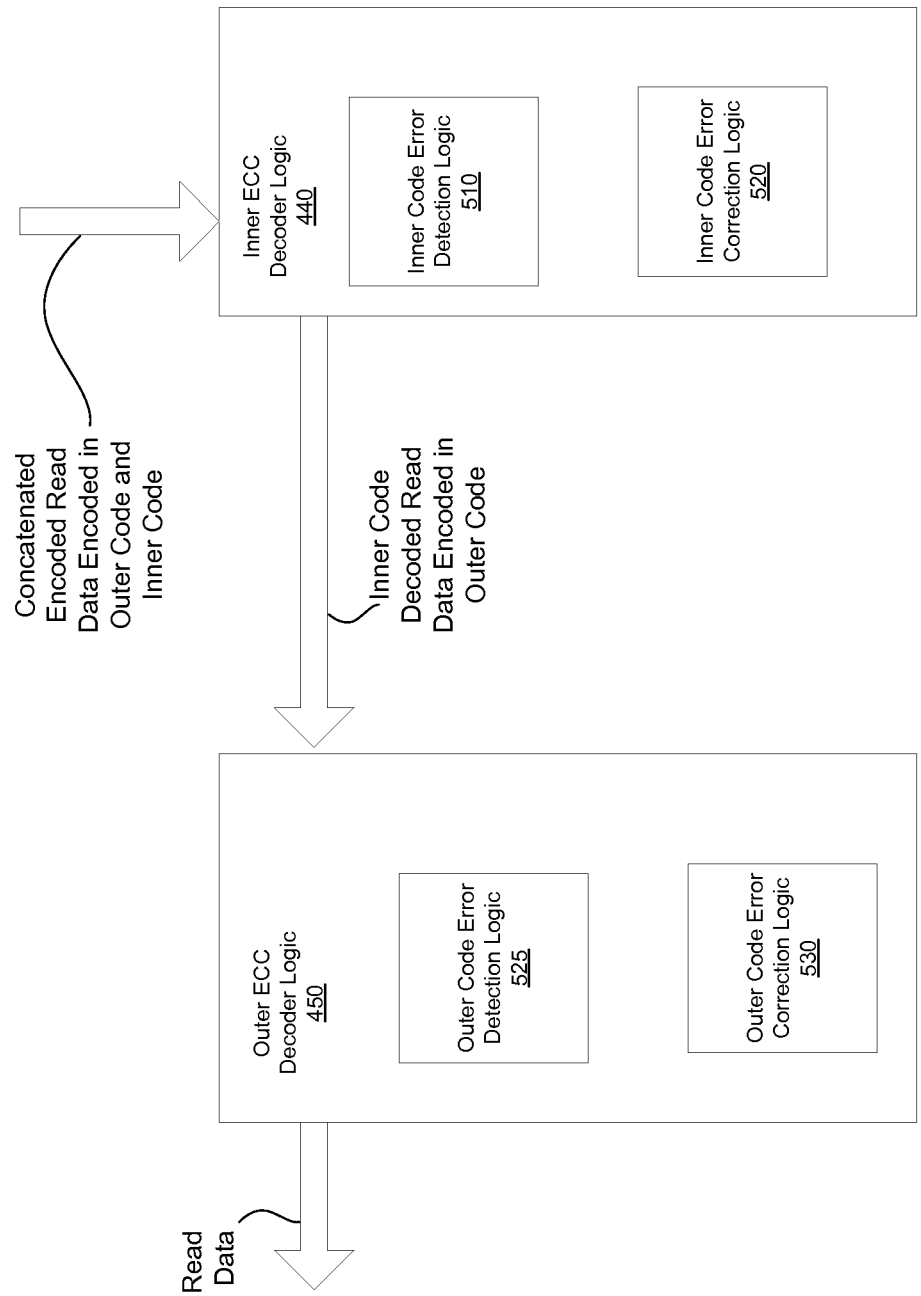
FIG. 5 illustrates in greater detail an architecture of an outer code decoder and an inner code decoder of a memory controller and memory, respectively, employing distributed concatenated error correction in accordance with an embodiment of the present disclosure.

As shown in FIG. 5, the inner ECC decoder logic 440 of FIG. 4 includes an error detection logic 510 which utilizes the redundant data which was added by the inner code encoding as described above, to detect whether the read data being decoded contains errors as indicated by the redundant data. If error detection logic 510 detects errors, the errors may be corrected (block 354, FIG. 3b) by suitable correction logic such as the inner code error correction logic 520 (FIG. 5) of the inner ECC decoder logic 440.

As previously mentioned, the inner ECC code of one embodiment may be a convolutional code, for example. Numerous algorithms are suitable for decoding convolutional ECC codes. For example, for relatively short codes, the Viterbi algorithm is often employed for error detection and correction because it frequently provides good performance and parallel calculation capability. For relatively long codes, sequential decoding algorithms are frequently employed, such as the Fano algorithm, for example. An inner ECC decoder logic may be implemented in one or more of hardware, software and firmware.

Upon decoding (block 346, FIG. 3b) the concatenated encoded read data from the memory circuit array and detecting (block 350) and correcting (block 354) any detected errors, so that the encoded read data is no longer encoded with respect to the inner error correction code, the encoded read data still encoded in accordance the outer error correction code, is decoded (block 358) in a second decoding of distributed concatenated error correction in accordance with one embodiment of the present description. More specifically, the encoded read data is decoded from the outer ECC code of the concatenated error correction using outer ECC logic on a die different from the die on which the inner ECC logic is disposed. As previously mentioned, the outer ECC code may be a Reed-Solomon error correction code, for example, but it is appreciated that other error correction codes may be employed in an outer correction code of distributed concatenated error correction in accordance with the present description.

FIG. 4 shows an embodiment of the memory controller die 410 of the memory controller 30 which includes an outer ECC decoder logic 450 of the outer ECC logic 80. The outer ECC decoder logic 450 is configured to decode in accordance with the outer error correction code, encoded read data from the memory circuit which has previously been decoded from the inner error correction code but remains encoded in the outer error correction code. As shown in FIG. 4, outer ECC decoder logic 450 is disposed on a die which in this embodiment, is the memory controller die 410, which is different from a die 424 on which an inner ECC decoder logic 440 of the inner ECC logic 70 of the memory circuit 40 is disposed. Although the embodiment of FIG. 4 depicts the inner ECC decoder logic 440 and the outer ECC decoder logic 450 as disposed separately on the memory circuit die 424 and the memory controller die 410, respectively, it is appreciated that the inner and outer ECC decoder logic circuits of distributed concatenated error correction in accordance with the present description, may be distributed separately over other types of separate dies such as the dies of processors, I/O controllers, etc.

In another operation of FIG. 3b, the encoded read data being processed by the outer ECC decoder logic may be checked (block 362, FIG. 3b) by an error detection logic of the outer ECC decoder logic, to determine if the decoded read data contains erroneous data. Such erroneous data may have been caused by corruption of the encoded write data which may have occurred at various stages such as when the encoded write data was transmitted to the memory cell array 430 or while the encoded write data was being stored in the memory cell array 430, or being read from the memory cell array or processed by the inner ECC logic, for example.

As shown in FIG. 5, the outer ECC decoder logic 450 of FIG. 4 includes an error detection logic 525 which utilizes the redundant data which was added by the outer code encoding as described above, to detect whether the read data being decoded contains errors as indicated by the redundant data. If error detection logic 525 detects errors, the errors may be corrected (block 366, FIG. 3b) by suitable correction logic such as the outer code error correction logic 530 (FIG. 5) of the outer ECC decoder logic 450. Upon completion of the decoding first by the inner ECC decoder logic and then by the outer ECC decoder logic, the concatenated encoded read data has been fully decoded (and corrected if errors detected) and may be forwarded (block 370) to entity requesting the read data.

As previously mentioned, the outer ECC code of one embodiment may be a Reed-Solomon code, for example. Numerous algorithms may be suitable for decoding Reed-Solomon ECC codes. Examples may include Peterson decoders, Berlekamp-Massey decoders, Euclidean decoders, time domain decoders, frequency domain decoders, etc. An outer ECC decoder logic may be implemented in one or more of hardware, software and firmware.

Figure 6A:
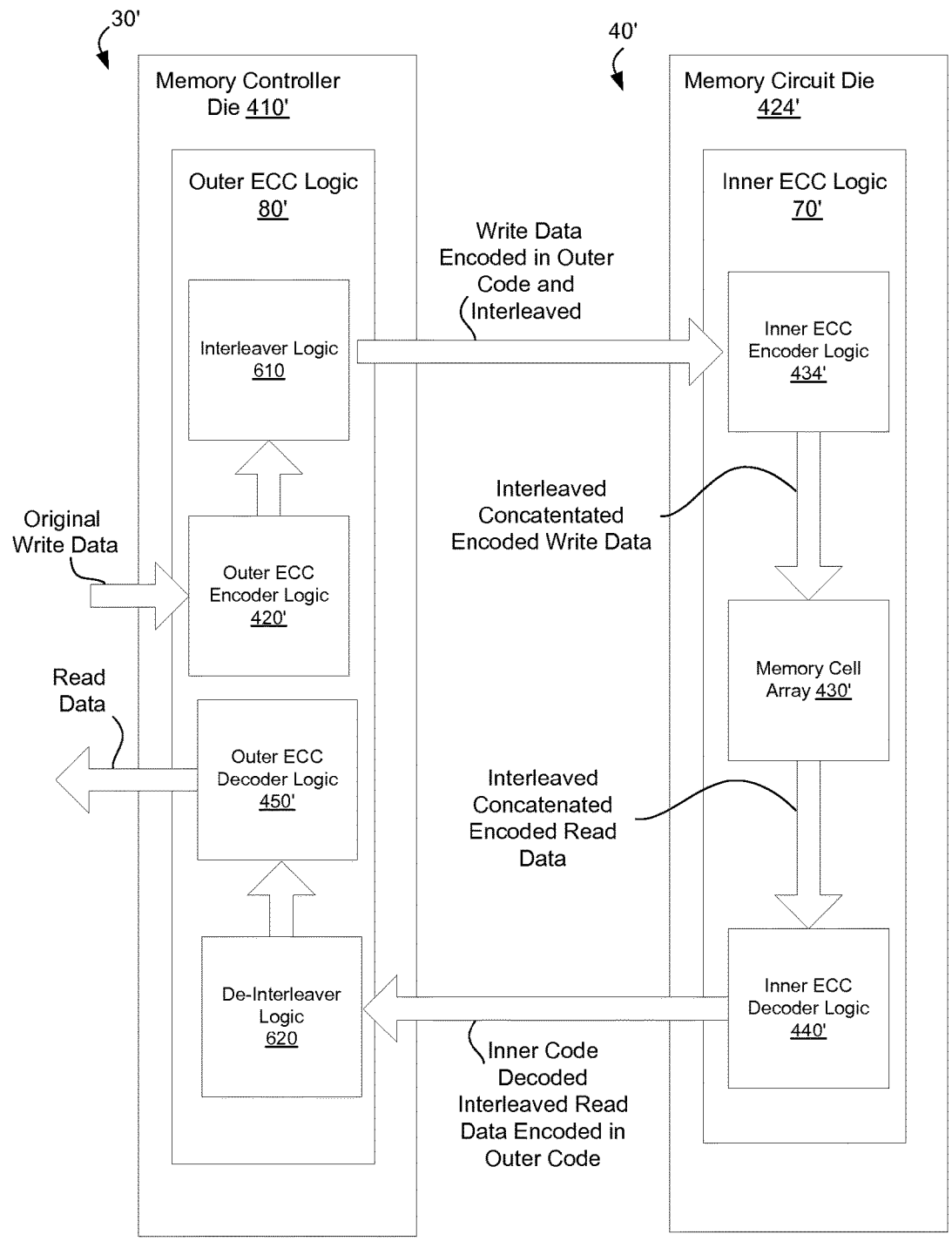
FIGS. 6a and 6b illustrate additional embodiments of architectures of a memory and memory controller, employing distributed concatenated error correction having interleaving in accordance with an embodiment of the present disclosure.

FIG. 6a shows an embodiment of distributed concatenated error correction in accordance with the present description in which the distributed concatenated error correction code logic includes interleaver logic 610 to shuffle outer error code encoded write data from an original order before it is encoded by the inner error correction code logic 434' in the inner error correction code. As shown in FIG. 6a, the write data encoded in the outer error correction code and interleaved by the interleaver logic 610, is received and encoded by the inner ECC encoder logic 434' to provide interleaved concatenated encoded write data to the memory cell array 430'. The inner ECC encoder logic 434' and the inner ECC decoder logic 440' of the inner ECC logic 70' of the memory circuit die 424' may be the same or similar to the correspondingly numbered features of the embodiment of FIG. 4.

A de-interleaver logic 620 of the distributed concatenated error correction code logic restores the original order of the outer error code encoded write data before it is decoded by the outer error correction code decoder logic 450' from the outer error correction code. Thus, the interleaved concatenated encoded read data from the memory cell array 430' is decoded from the inner error correction code by the inner ECC decoder logic 440' to provide interleaved outer code encoded read data to the de-interleaver logic 620 which de-interleaves the read data for decoding from the outer error correction code by the outer ECC decoder logic 450'. The outer ECC encoder logic 420' and the outer ECC decoder logic 450' of the outer ECC logic 80' of the memory controller die 410' may be the same or similar to the correspondingly numbered features of the embodiment of FIG. 4.

Figure 6B:
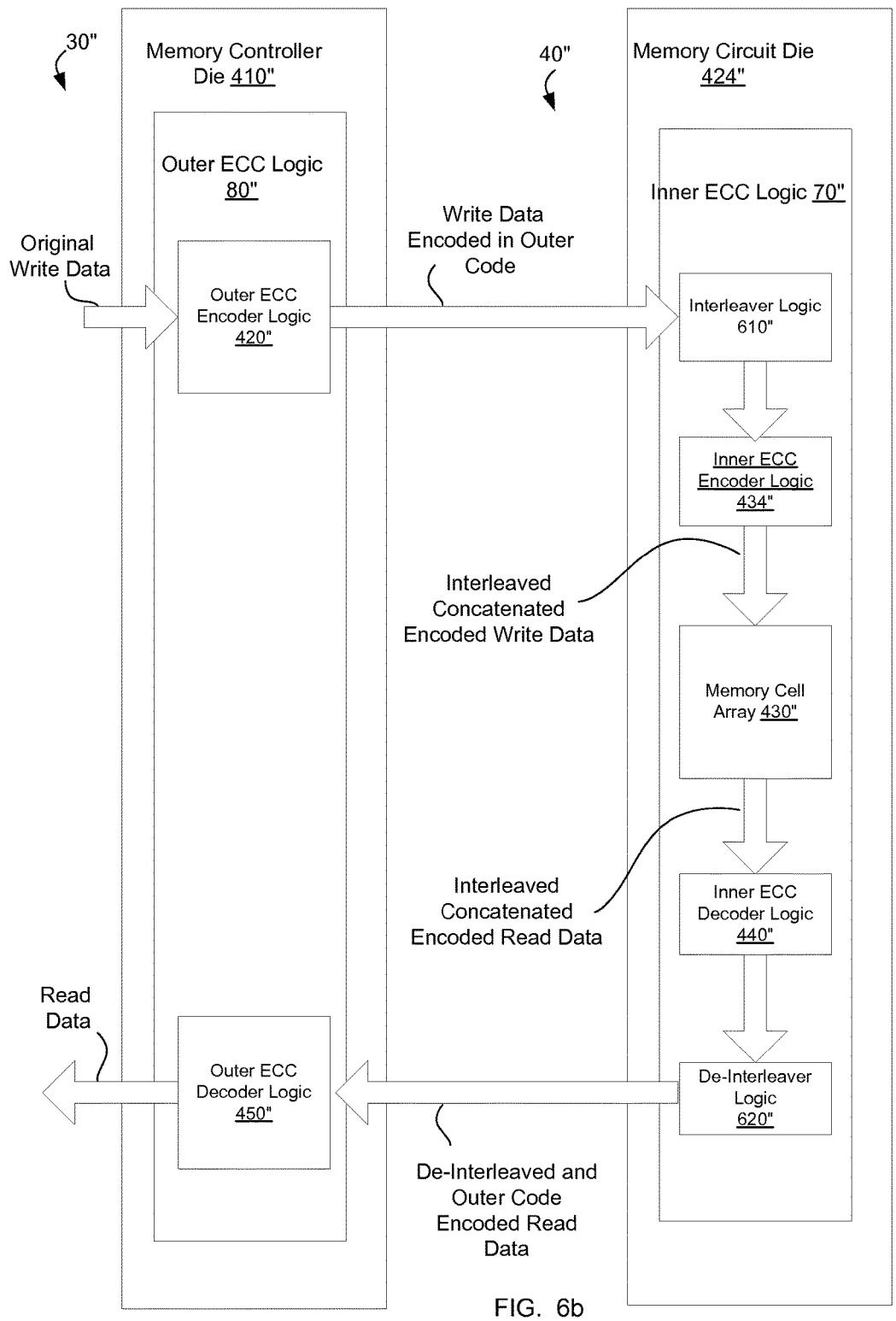

In the embodiment of FIG. 6a, the interleaver logic 610 and the de-interleaver logic 620 are implemented as a portion of the outer ECC logic 80' and thus are positioned on the memory controller die 410' in this embodiment. FIG. 6b shows another embodiment in which an interleaver logic 610" and a de-interleaver logic 620" are implemented as a portion of the inner ECC logic 70" and thus are positioned on the memory circuit die 424" in this embodiment. it is appreciated that the interleaver and de-interleaver of distributed concatenated error correction in accordance with the present description, may be disposed on other types of dies such as the dies of processors, I/O controllers, etc. The inner ECC encoder logic 434" and the inner ECC decoder logic 440" of the inner ECC logic 70" of the memory circuit die 424" and the outer ECC encoder logic 420" and the outer ECC decoder logic 450" of the outer ECC logic 80" of the memory controller die 410" may be the same or similar to the correspondingly numbered features of the embodiment of FIG. 4.

It is further appreciated that some embodiments of distributed concatenated error correction in accordance with the present description, may lack interleaving and de-interleaving of data. In those embodiments which do employ an interleaver and de-interleaver, the shuffling of the data permits the bits affected by an error burst to be distributed among more blocks of data to facilitate error correction, instead of being concentrated as a burst in a fewer number of blocks which may be too concentrated to be corrected.

It is seen from the above that in one embodiment, distributed concatenated error correction logic in accordance with the present description includes an outer ECC logic disposed on the integrated circuit die of the memory controller, for example, and an inner ECC logic disposed on one or more integrated circuit dies which are different from the die on which the outer ECC logic is disposed. For example, the inner ECC logic may be disposed on one or more dies of the memory circuits containing arrays of memory cells while the outer ECC logic is disposed on the die of the memory controller, for example. Such an arrangement may, for example, obviate upgrading the ECC logic of the memory controller each time the design of the memory circuits changes, notwithstanding that the new memory circuit design may have an increased RBER. For example, should a new memory circuit design exhibit an increase in RBER as compared to the prior generation memory circuit design, the increased RBER may be accommodated by upgrading the inner ECC logic which may in one embodiment, be disposed on the same integrated circuit dies as the memory cells of the memory circuits. Conversely, the outer ECC logic which may be disposed on the memory controller which is typically on a separate die, may remain unchanged. In this manner, distributed concatenated error correction in accordance with the present description may be employed to increase the usefulness of memory controllers for later generation memory circuits.

EXAMPLES

The following examples pertain to further embodiments.

Example 1 is apparatus, comprising: an array of memory cells; a first integrated circuit die; a second integrated circuit die having a memory controller electrically coupled to the array of cells of the memory circuit and configured to control the array of memory cells; and concatenated error correction code logic including an outer error correction code logic disposed on the second integrated circuit die of the memory controller, and having outer error correction code encoder logic configured to encode write data for the array of memory cells in an outer error correction code, and an inner error correction code logic disposed on the first integrated circuit die, and having an inner error correction code encoder logic configured to encode in an inner error correction code, outer error correction code encoded write data from the memory controller so that write data is encoded in concatenated error code comprising the outer error correction code and the inner error correction code.

In Example 2, the subject matter of Examples 1-9 (excluding the present example) can optionally include a memory circuit disposed on the first integrated circuit die and including said array of memory cells.

In Example 3, the subject matter of Examples 1-9 (excluding the present example) can optionally include wherein the inner error correction code logic disposed on the first integrated circuit die of the memory circuit, further has inner error correction decoder logic configured to decode in accordance with the inner error correction code, concatenated encoded read data from the memory circuit which has been encoded in both the outer error correction code and the inner error correction code so that the concatenated encoded read data is decoded with respect to the inner error correction code, and wherein the outer error correction code logic disposed on the second integrated circuit die of the memory controller, further has outer error correction code decoder logic configured to decode in accordance with the outer error correction code, the outer error correction code encoded read data from the memory circuit, which has been encoded in the outer error correction code.

In Example 4, the subject matter of Examples 1-9 (excluding the present example) can optionally include wherein the concatenated error correction code logic further includes interleaver logic to shuffle outer error code encoded write data from an original order before it is encoded by the inner error correction code logic in the inner error correction code.

In Example 5, the subject matter of Examples 1-9 (excluding the present example) can optionally include wherein the concatenated error correction code logic further includes de-interleaver logic to restore the original order of the outer error code encoded write data before it is decoded by the outer error correction code decoder logic from the outer error correction code.

In Example 6, the subject matter of Examples 1-9 (excluding the present example) can optionally include wherein the outer error correction code is a Reed-Solomon error correction code.

In Example 7, the subject matter of Examples 1-9 (excluding the present example) can optionally include wherein the outer error correction code is a Reed-Solomon error correction code which encodes write data as symbols, and wherein the concatenated error correction code logic includes interleaver logic to shuffle the original order of the symbols encoding the write data for the memory circuit, and de-interleaver logic to restore the original order of the symbols read from the memory circuit.

In Example 8, the subject matter of Examples 1-9 (excluding the present example) can optionally include wherein the inner error correction code is a convolutional error correction code.

In Example 9, the subject matter of Examples 1-9 (excluding the present example) can optionally include a computing system for use with a display, comprising: a memory wherein the memory includes a memory circuit having said array of memory cells disposed on said first integrated circuit die, and said memory controller disposed on said second integrated circuit die and said concatenated error correction code logic; a processor configured to write data in and read data from the memory; and a video controller configured to display information represented by data in the memory.

Example 10 is computing system for use with a display, comprising: a memory; a processor configured to write data in and read data from the memory; a video controller configured to display information represented by data in the memory; wherein the memory includes a memory circuit having an array of memory cells disposed on a first integrated circuit die, and a memory controller disposed on a second integrated circuit die and electrically coupled to the array of cells of the memory circuit and configured to control the array of memory cells; and concatenated error correction code logic including an outer error correction code logic disposed on the second integrated circuit die of the memory controller, and having outer error correction code encoder logic configured to encode write data for the array of memory cells in an outer error correction code, and an inner error correction code logic disposed on the first integrated circuit die, and having an inner error correction code encoder logic configured to encode in an inner error correction code, outer error correction code encoded write data from the memory controller so that write data is encoded in concatenated error code comprising the outer error correction code and the inner error correction code.

In Example 11, the subject matter of Examples 10-17 (excluding the present example) can optionally include a memory circuit disposed on the first integrated circuit die and including said array of memory cells.

In Example 12, the subject matter of Examples 10-17 (excluding the present example) can optionally include wherein the inner error correction code logic disposed on the first integrated circuit die of the memory circuit, further has inner error correction decoder logic configured to decode in accordance with the inner error correction code, concatenated encoded read data from the memory circuit which has been encoded in both the outer error correction code and the inner error correction code so that the concatenated encoded read data is decoded with respect to the inner error correction code, and wherein the outer error correction code logic disposed on the second integrated circuit die of the memory controller, further has outer error correction code decoder logic configured to decode in accordance with the outer error correction code, the outer error correction code encoded read data from the memory circuit, which has been encoded in the outer error correction code.

In Example 13, the subject matter of Examples 10-17 (excluding the present example) can optionally include wherein the concatenated error correction code logic further includes interleaver logic to shuffle outer error code encoded write data from an original order before it is encoded by the inner error correction code logic in the inner error correction code.

In Example 14, the subject matter of Examples 10-17 (excluding the present example) can optionally wherein the concatenated error correction code logic further includes de-interleaver logic to restore the original order of the outer error code encoded write data before it is decoded by the outer error correction code decoder logic from the outer error correction code.

In Example 15, the subject matter of Examples 10-17 (excluding the present example) can optionally include wherein the outer error correction code is a Reed-Solomon error correction code.

In Example 16, the subject matter of Examples 10-17 (excluding the present example) can optionally include wherein the outer error correction code is a Reed-Solomon error correction code which encodes write data as symbols, and wherein the concatenated error correction code logic includes interleaver logic to shuffle the original order of the symbols encoding the write data for the memory circuit, and de-interleaver logic to restore the original order of the symbols read from the memory circuit.

In Example 17, the subject matter of Examples 10-17 (excluding the present example) can optionally include wherein the inner error correction code is a convolutional error correction code.

Example 18 is a method, comprising: writing data to an array of memory cells disposed on a first integrated circuit die using a memory controller disposed on a second integrated circuit die and concatenated error correction code logic having outer error correction code logic disposed on the second integrated circuit die of the memory controller and having inner error correction code logic disposed on the first integrated circuit die, said writing data including: encoding write data for the array of memory cells in an outer error correction code using an outer error correction code encoder logic of the outer error correction code logic disposed on the second integrated circuit die of the memory controller, and encoding the outer error correction code encoded data in an inner error correction code using the inner using an inner error correction code encoder logic of the inner error correction code logic disposed on the first integrated circuit die, so that write data is encoded in concatenated error code comprising the outer error correction code and the inner error correction code.

In Example 19, the subject matter of Examples 18-25 (excluding the present example) can optionally include wherein the first integrated circuit die has a memory circuit disposed thereon and includes said array of memory cells.

In Example 20, the subject matter of Examples 18-25 (excluding the present example) can optionally include decoding concatenated error correction code encoded read data read from the memory cells using an inner error correction decoder logic of the inner error correction code logic disposed on the first integrated circuit die of the memory circuit, so that the concatenated error correction code encoded read data is decoded with respect to the inner error correction code, and decoding outer error correction code encoded read data using an outer error correction code decoder logic of the outer error correction code logic disposed on the second integrated circuit die of the memory controller, so that the read data is decoded with respect to both the inner error correction code and the outer error correction code.

In Example 21, the subject matter of Examples 18-25 (excluding the present example) can optionally include shuffling outer error code encoded write data from an original order before it is encoded by the inner error correction code logic in the inner error correction code, using interleaver logic.

In Example 22, the subject matter of Examples 18-25 (excluding the present example) can optionally include comprising restoring the original order of the outer error code encoded write data before it is decoded by the outer error correction code decoder logic from the outer error correction code.

In Example 23, the subject matter of Examples 18-25 (excluding the present example) can optionally include wherein the outer error correction code is a Reed-Solomon error correction code.

In Example 24, the subject matter of Examples 18-25 (excluding the present example) can optionally wherein the encoding write data for the array of memory cells in an outer error correction code using an outer error correction code encoder logic includes encoding the write data in a Reed-Solomon error correction code which encodes write data as symbols, wherein the method further comprises shuffling the original order of the symbols encoding the write data for the memory circuit using an interleaver logic of the concatenated error correction code logic, and wherein the method further comprises restoring the original order of the using de-interleaver logic of the concatenated error correction code logic.

In Example 25, the subject matter of Examples 18-25 (excluding the present example) can optionally include wherein the inner error correction code is a convolutional error correction code.

Example 26 is an apparatus comprising means to perform a method as claimed in any preceding claim.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus, comprising:
an array of memory cells;
a first integrated circuit die;
a memory circuit disposed on the first integrated circuit die and including said array of memory cells;
a second integrated circuit die having a memory controller electrically coupled to the array of cells of the memory circuit and configured to control the array of memory cells; and
concatenated error correction code logic including an outer error correction code logic disposed on the second integrated circuit die of the memory controller, and having outer error correction code encoder logic configured to encode write data for the array of memory cells in an outer error correction code, and an inner error correction code logic disposed on the first integrated circuit die, and having an inner error correction code encoder logic configured to encode in an inner error correction code, outer error correction code encoded write data from the memory controller so that write data is encoded in concatenated error code comprising the outer error correction code and the inner error correction code;
wherein the inner error correction code logic disposed on the first integrated circuit die of the memory circuit, further has inner error correction decoder logic configured to decode in accordance with the inner error correction code, concatenated encoded read data from the memory circuit which has been encoded in both the outer error correction code and the inner error correction code so that the concatenated encoded read data is decoded with respect to the inner error correction code, and wherein the outer error correction code logic disposed on the second integrated circuit die of the memory controller, further has outer error correction code decoder logic configured to decode in accordance with the outer error correction code, outer error correction code encoded read data from the memory circuit, which has been encoded in the outer error correction code.

2. The apparatus of claim 1 wherein the concatenated error correction code logic further includes interleaver logic to shuffle outer error code encoded write data from an original order before it is encoded by the inner error correction code logic in the inner error correction code.

3. The apparatus of claim 2 wherein the concatenated error correction code logic further includes de-interleaver logic to restore the original order of the outer error code encoded write data before it is decoded by the outer error correction code decoder logic from the outer error correction code.

4. The apparatus of claim 1 wherein the outer error correction code is a Reed-Solomon error correction code.

5. The apparatus of claim 1 wherein the outer error correction code is a Reed-Solomon error correction code which encodes write data as symbols, and wherein the concatenated error correction code logic includes interleaver logic to shuffle the original order of the symbols encoding the write data for the memory circuit, and de-interleaver logic to restore the original order of symbols read from the memory circuit.

6. The apparatus of claim 5 wherein the inner error correction code is a convolutional error correction code.

7. A computing system for use with a display, comprising:
a memory;
a processor configured to write data in and read data from the memory;
a video controller configured to display information represented by data in the memory;
wherein the memory includes a memory circuit having an array of memory cells disposed on a first integrated circuit die, and a memory controller disposed on a second integrated circuit die and electrically coupled to the array of cells of the memory circuit and configured to control the array of memory cells; and
concatenated error correction code logic including an outer error correction code logic disposed on the second integrated circuit die of the memory controller, and having outer error correction code encoder logic configured to encode write data for the array of memory cells in an outer error correction code, and an inner error correction code logic disposed on the first integrated circuit die, and having an inner error correction code encoder logic configured to encode in an inner error correction code, outer error correction code encoded write data from the memory controller so that write data is encoded in concatenated error code comprising the outer error correction code and the inner error correction code;

wherein the inner error correction code logic disposed on the first integrated circuit die of the memory circuit, further has inner error correction decoder logic configured to decode in accordance with the inner error correction code, concatenated encoded read data from the memory circuit which has been encoded in both the outer error correction code and the inner error correction code so that the concatenated encoded read data is decoded with respect to the inner error correction code, and wherein the outer error correction code logic disposed on the second integrated circuit die of the memory controller, further has outer error correction code decoder logic configured to decode in accordance with the outer error correction code, outer error correction code encoded read data from the memory circuit, which has been encoded in the outer error correction code.

8. The system of claim 7 wherein the concatenated error correction code logic further includes interleaver logic to shuffle outer error code encoded write data from an original order before it is encoded by the inner error correction code logic in the inner error correction code.

9. The system of claim 8 wherein the concatenated error correction code logic further includes de-interleaver logic to restore the original order of the outer error code encoded write data before it is decoded by the outer error correction code decoder logic from the outer error correction code.

10. The system of claim 7 wherein the outer error correction code is a Reed-Solomon error correction code.

11. The system of claim 7 wherein the outer error correction code is a Reed-Solomon error correction code which encodes write data as symbols, and wherein the concatenated error correction code logic includes interleaver logic to shuffle the original order of the symbols encoding the write data for the memory circuit, and de-interleaver logic to restore the original order of symbols read from the memory circuit.

12. The system of claim 11 wherein the inner error correction code is a convolutional error correction code.

13. A method, comprising:

writing data to an array of memory cells of a memory circuit disposed on a first integrated circuit die using a memory controller disposed on a second integrated circuit die and concatenated error correction code logic having outer error correction code logic disposed on the second integrated circuit die of the memory controller and having inner error correction code logic disposed on the first integrated circuit die, said writing data including:

encoding write data for the array of memory cells in an outer error correction code using an outer error correction code encoder logic of the outer error correction code logic disposed on the second integrated circuit die of the memory controller, and encoding outer error correction code encoded data in an inner error correction code using the inner using an inner error correction code encoder logic of the inner error correction code logic disposed on the first integrated circuit die, so that write data is encoded in concatenated error code comprising the outer error correction code and the inner error correction code, and decoding concatenated error correction code encoded read data read from the memory cells using an inner error correction decoder logic of the inner error correction code logic disposed on the first integrated circuit die of the memory circuit, so that the concatenated error correction code encoded read data is decoded with respect to the inner error correction code, and decoding outer error correction code encoded read data using an outer error correction code decoder logic of the outer error correction code logic disposed on the second integrated circuit die of the memory controller, so that the read data is decoded with respect to both the inner error correction code and the outer error correction code.

14. The method of claim 13 further comprising shuffling outer error code encoded write data from an original order before it is encoded by the inner error correction code logic in the inner error correction code, using interleaver logic.

15. The method of claim 14 further comprising restoring the original order of the outer error code encoded write data before it is decoded by the outer error correction code decoder logic from the outer error correction code.

16. The method of claim 13 wherein the outer error correction code is a Reed-Solomon error correction code.

17. The method of claim 13 wherein the encoding write data for the array of memory cells in an outer error correction code using an outer error correction code encoder logic includes encoding the write data in a Reed-Solomon error correction code which encodes write data as symbols, wherein the method further comprises shuffling the original order of the symbols encoding the write data for the memory circuit using an interleaver logic of the concatenated error correction code logic, and wherein the method further comprises restoring the original order of the symbols using de-interleaver logic of the concatenated error correction code logic.

18. The method of claim 17 wherein the inner error correction code is a convolutional error correction code.

* * * * *